US008507995B2

(12) United States Patent
Masuoka et al.

(10) Patent No.: US 8,507,995 B2
(45) Date of Patent: *Aug. 13, 2013

(54) SEMICONDUCTOR MEMORY DEVICE

(75) Inventors: Fujio Masuoka, Tokyo (JP); Shintaro Arai, Tokyo (JP)

(73) Assignee: Unisantis Electronics Singapore Pte Ltd., Singapore (SG)

( * ) Notice: Subject to any disclaimer, the term of this patent is extended or adjusted under 35 U.S.C. 154(b) by 315 days.

This patent is subject to a terminal disclaimer.

(21) Appl. No.: 12/882,847

(22) Filed: Sep. 15, 2010

(65) Prior Publication Data

US 2011/0062529 A1    Mar. 17, 2011

Related U.S. Application Data

(60) Provisional application No. 61/276,889, filed on Sep. 17, 2009.

(30) Foreign Application Priority Data

Sep. 16, 2009    (JP) .................................. 2009-214094

(51) Int. Cl.
    *H01L 27/11*    (2006.01)
(52) U.S. Cl.
    USPC .... 257/379; 257/350; 257/380; 257/E27.098; 257/E27.101
(58) Field of Classification Search
    USPC .................. 257/350, 379, E27.098, E27.101, 257/380
    See application file for complete search history.

(56) References Cited

U.S. PATENT DOCUMENTS

| 4,890,144 | A | | 12/1989 | Teng et al. |
| 5,258,635 | A | | 11/1993 | Nitayama et al. |
| 5,308,778 | A | | 5/1994 | Fitch et al. |
| 5,308,782 | A | | 5/1994 | Mazuré et al. |
| 5,330,927 | A | | 7/1994 | Lee |
| 5,376,814 | A | | 12/1994 | Lee |
| 5,398,200 | A | | 3/1995 | Mazuré et al. |
| 5,416,350 | A | | 5/1995 | Watanabe |
| 5,576,238 | A | * | 11/1996 | Fu .................................. 438/152 |
| 5,612,563 | A | | 3/1997 | Fitch et al. |
| 5,994,735 | A | | 11/1999 | Maeda et al. |

(Continued)

FOREIGN PATENT DOCUMENTS

| EP | 2239772 A1 | 10/2010 |
| EP | 2246883 A1 | 11/2010 |

(Continued)

OTHER PUBLICATIONS

Co-pending U.S. Appl. No. 12/703,968.

(Continued)

*Primary Examiner* — Kenneth Parker
*Assistant Examiner* — Jose R Diaz
(74) *Attorney, Agent, or Firm* — Brinks Hofer Gilson & Lione

(57) ABSTRACT

In a static memory cell configured using four MOS transistors and two load resistance elements, the MOS transistors are formed on diffusion layers formed on a substrate. The diffusion layers serve as memory nodes. The drain, gate and source of the MOS transistors are arranged in the direction orthogonal to the substrate, and the gate surrounds a columnar semiconductor layer. In addition, the load resistance elements are formed by contact plugs. In this way, it is possible to form a SRAM cell with a small area.

8 Claims, 18 Drawing Sheets

(56) References Cited

U.S. PATENT DOCUMENTS

| | | | |
|---|---|---|---|
| 6,107,660 | A | 8/2000 | Yang et al. |
| 6,127,209 | A | 10/2000 | Maeda et al. |
| 6,312,992 | B1 * | 11/2001 | Cho .................. 438/268 |
| 6,461,900 | B1 | 10/2002 | Sundaresan et al. |
| 6,642,575 | B1 | 11/2003 | Ono et al. |
| 6,768,166 | B2 * | 7/2004 | Hagemeyer ............. 257/324 |
| 6,891,225 | B2 | 5/2005 | Horiguchi et al. |
| 8,154,086 | B2 | 4/2012 | Masuoka et al. |
| 8,158,468 | B2 | 4/2012 | Masuoka et al. |
| 2002/0027802 | A1 | 3/2002 | Noble |
| 2002/0195652 | A1 | 12/2002 | Maeda et al. |
| 2003/0136978 | A1 | 7/2003 | Takaura et al. |
| 2004/0007737 | A1 | 1/2004 | Cho et al. |
| 2004/0084676 | A1 | 5/2004 | Takaura et al. |
| 2004/0113207 | A1 | 6/2004 | Hsu et al. |
| 2004/0135215 | A1 | 7/2004 | Song |
| 2005/0253143 | A1 | 11/2005 | Takaura et al. |
| 2007/0007601 | A1 | 1/2007 | Hsu et al. |
| 2008/0057636 | A1 | 3/2008 | Lindsay et al. |
| 2009/0200604 | A1 | 8/2009 | Chidambarrao et al. |

FOREIGN PATENT DOCUMENTS

| | | |
|---|---|---|
| JP | 61-013661 A | 1/1986 |
| JP | 02-071556 A | 3/1990 |
| JP | 02-156664 | 6/1990 |
| JP | 02-156664 A | 6/1990 |
| JP | 02-188966 A | 7/1990 |
| JP | 03-145761 A | 6/1991 |
| JP | 06-069441 A | 3/1994 |
| JP | 06-151772 A | 5/1994 |
| JP | 07-099311 A | 4/1995 |
| JP | 10-079482 A | 3/1998 |
| JP | 2000-068516 A | 3/2000 |
| JP | 2003-179160 A | 6/2003 |
| JP | 2003-224211 A | 8/2003 |
| JP | 2004-193588 A | 7/2004 |
| JP | 2008-205168 A | 9/2008 |
| WO | WO/2009/096000 | 8/2009 |
| WO | WO 2009/096465 A1 | 8/2009 |
| WO | WO 2009/096466 A1 | 8/2009 |
| WO | WO/2009/096467 | 8/2009 |
| WO | WO 2009/096467 A1 | 8/2009 |
| WO | WO 2009/096468 A1 | 8/2009 |

OTHER PUBLICATIONS

Extended European Search Report for European Application No. 10009571.0, dated Dec. 14, 2010, 5 pages.

International Search Report for International Application No. PCT/JP2008/052565, dated Mar. 25, 2008, 1 page.

Written Opinion of the International Searching Authority for International Application No. PCT/JP2008/052565, dated Mar. 25, 2008, 5 pages.

International Search Report for International Application No. PCT/JP2008/051303, dated Apr. 8, 2008, 2 pages.

Written Opinion of the International Searching Authority for International Application No. PCT/JP2008/051303, dated Apr. 8, 2008, 6 pages.

International Search Report for International Application No. PCT/JP2009/052557, dated Mar. 10, 2009, 1 page.

Written Opinion of the International Searching Authority for International Application No. PCT/JP2009/052557, dated Mar. 10, 2009, 5 pages.

International Search Report for International Application No. PCT/JP2009/051462, dated Apr. 21, 2009, 2 pages.

Written Opinion of the International Searching Authority for International Application No. PCT/JP2009/051462, dated Apr. 21, 2009, 5 pages.

Wolf, Stanley et al., "Silicon Processing for the VLSI Era," Lattice Press, 2000, 2nd Edition, pp. 363-386.

Examination Report from counterpart European Application No. 10009571.0, dated Jul. 28, 2011, 6 pages.

Office Action for U.S. Appl. No. 13/417,967, dated Apr. 18, 5 pages.

* cited by examiner

SEMICONDUCTOR MEMORY DEVICE

RELATED APPLICATIONS

Pursuant to 35 U.S.C. §119(e), this application claims the benefit of the filing date of Provisional U.S. Patent Application Ser. No. 61/276,889 filed on Sep. 17, 2009. This application also claims priority under 35 U.S.C. §119(a) to JP2009-214094 filed on Sep. 16, 2009. The entire contents of these applications are hereby incorporated by reference.

BACKGROUND OF THE INVENTION

1. Field of the Invention

The present invention relates to a semiconductor memory device and particularly to a semiconductor memory device composed of an SRAM (static random access memory).

2. Description of the Related Art

SGT (surrounding gate transistor) technologies are known as measures for attaining higher levels of integration and performance in semiconductor devices (disclosed for example in Unexamined Japanese Patent Application KOKAI Publication No. H2-188966). SGTs are vertical gate transistors in which a columnar semiconductor layer is formed on the surface of a semiconductor substrate and a gate is formed on the sidewall of the columnar semiconductor layer to surround it. In such an SGT, the drain, gate, and source are arranged in the direction orthogonal to the substrate. Therefore, the SGT has a significantly reduced occupying area compared with conventional planar transistors.

With the increasingly strong demands in recent years for large capacity SRAMs installed in LSIs (large-scale integrated circuits), it is desired to attain an SRAM having a small cell area with the use of SGTs. It is possible in an SRAM using SGTs, to reduce the SRAM cell area compared with SRAMs composed of conventional planar transistors by exploiting characteristics of vertical transistors.

FIG. 17A is a plan view of an E/R 4T-SRAM composed of four SGTs and two load resistance elements shown in an embodiment of Unexamined Japanese Patent Application KOKAI Publication No. H2-188966 and FIG. 17B is a cross-sectional view at the section line A-A' in FIG. 17A.

In FIG. 17A and FIG. 17B, this SRAM cell is composed of access transistors formed by two columnar silicon layers (701a, 701b) and used for accessing the memory cell and driver transistors formed by two columnar silicon layers (702a, 702b) and used for driving the memory cell to read/write data, and two load resistance elements (Ra7, Rb7) formed by polysilicon wires. Lower diffusion layers (707a, 707b, 707) are formed at the bottoms of the columnar silicon layers and an upper diffusion layer 708 is formed in the upper part of them. Gate electrodes (706a to 706c) are formed around the columnar silicon layers. BL7 and BLB7 are bit lines and WL7 is a word line, Vcc7 is a power supply potential wire, and Vss7 is a ground potential wire. Furthermore, Ma7 and Mb7 are memory nodes formed by wiring layers and used for storing data.

The above-described conventional SRAM cell is formed of three diffusion layers (707a, 707b and 707). Therefore, reduction of cell area is limited by the width of each diffusion layer and distances between diffusion layers.

SUMMARY OF THE INVENTION

The purpose of the present invention is to attain an SRAM cell having a smaller area in an E/R 4T-SRAM using SGTs as described above.

To achieve the above objective, the semiconductor memory device according to the present invention is a semiconductor memory device comprising a static memory cell composed of four MOS transistors and two load resistance elements arranged on a substrate, wherein the four MOS transistors, in each of which a source diffusion layer, a drain diffusion layer, and a columnar semiconductor layer are formed on the substrate in a vertical hierarchical structure, the columnar semiconductor layer is provided between the source diffusion layer and drain diffusion layer, and a gate is formed on the sidewall of the columnar semiconductor layer, function as first and second NMOS access transistors for accessing the memory cell and as first and second NMOS driver transistors for driving memory nodes to write and read memory cell data; the first NMOS access transistor and first NMOS driver transistor adjoin each other; the second NMOS access transistor and second NMOS driver transistor adjoin each other; a first diffusion layer functioning as a first memory node holding data is provided on the substrate as a common diffusion layer to the first NMOS access transistor and first NMOS driver transistor; a second diffusion layer functioning as a second memory node holding data is provided on the substrate as a common diffusion layer to the second NMOS access transistor and second NMOS driver transistor; and the two load resistance elements are provided on the first and second diffusion layers, respectively.

Furthermore, in another preferable mode of the present invention, the above-described semiconductor memory device is structured as follows: one of the two load resistance elements is formed as a first contact plug formed on the first diffusion layer and consisting of semiconductor or metal and the other is formed as a second contact plug formed on the second diffusion layer and consisting of semiconductor or metal.

Furthermore, in another preferable mode of the present invention, in the above-described semiconductor memory device is structured as follows: at least one of the contacts formed on gate wires extending from the gate electrodes of the first and second NMOS access transistors is a common contact also used as the contact formed on a gate wire extending from the gate electrode of an NMOS access transistor of an adjoining memory cell.

Furthermore, in another preferable mode of the present invention, a gate wire extending from the gate of the first NMOS driver transistor formed on the first diffusion layer functioning as the first memory node is connected by a common contact shared with the second diffusion layer functioning as the second memory node; and a gate wire extending from the gate of the second NMOS driver transistor formed on the second diffusion layer functioning as the second memory node is connected by a common contact shared with the first diffusion layer functioning as the first memory node.

Furthermore, in another preferable mode of the present invention, in the above-described semiconductor memory device, the circumferences of the sidewalls of the columnar semiconductor layers forming the first and second NMOS driver transistors are equal to or longer than the circumference of the sidewall of the columnar semiconductor layers forming the first and second NMOS access transistors, or the circumferences of the sidewalls of the columnar semiconductor layers forming the first and second NMOS driver transistors are equal to or smaller than the circumference of the sidewall of the columnar semiconductor layers forming the first and second NMOS access transistors.

Furthermore, the above-described semiconductor memory device of the present invention may be structured as follows: the four MOS transistors are arranged in two rows and two columns on the substrate; the first NMOS access transistor is arranged at the row 1 column 1; the first NMOS driver transistor is arranged at the row 2 column 1; the second NMOS access transistor is arranged at the row 1 column 2; and the second NMOS driver transistor is arranged at the row 2 column 2.

In this case, the contact formed on a gate wire extending from the gates of the first and second NMOS access transistors may be shared.

Furthermore, the above-described semiconductor memory device of the present invention may be structured as follows: the four MOS transistors are arranged in two rows and two columns on the substrate; the first NMOS access transistor is arranged at the row 1 column 1; the first NMOS driver transistor is arranged at the row 2 column 1; the second NMOS access transistor is arranged at the row 2 column 2; and the second NMOS driver transistor is arranged at the row 1 column 2.

BRIEF DESCRIPTION OF THE DRAWINGS

A more complete understanding of this application can be obtained when the following detailed description is considered in conjunction with the following drawings, in which.

DETAILED DESCRIPTION OF THE PREFERRED EMBODIMENTS

Embodiments of the present invention will be described in detail hereafter with reference to the drawings. In each embodiment, it is assumed that the semiconductor memory device of the present invention is composed of an E/R 4T-SRAM. The same components are referred to by the same reference number throughout the figures for explaining the embodiments and duplicated explanation will be omitted.

Embodiment 1

Figure 1:
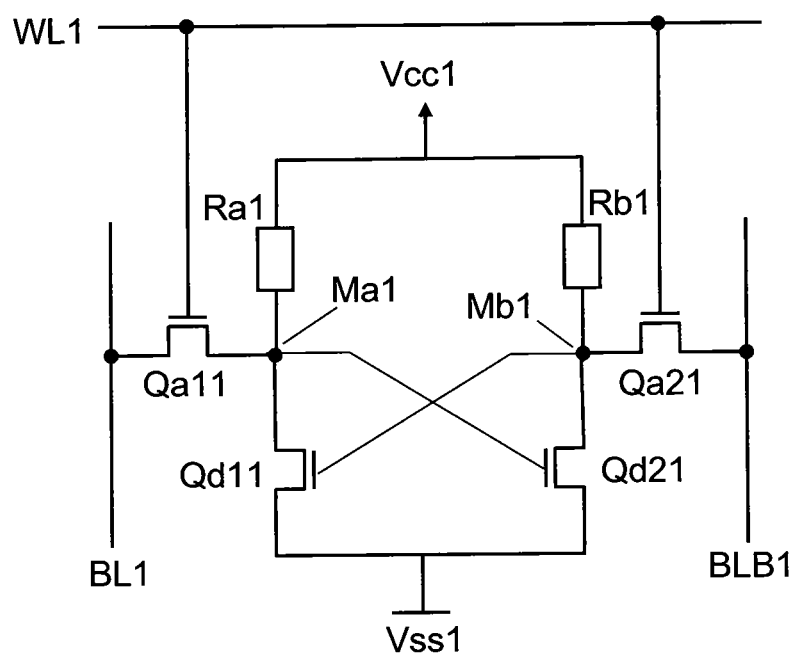
FIG. 1 is an equivalent circuit showing a memory cell of an SRAM of Embodiment 1 of the present invention.

FIG. 1 shows an equivalent circuit to a memory cell of an SRAM according to Embodiment 1 of the present invention. In FIG. 1, BL1 and BLB1 are bit lines, WL1 is a word line, Vcc1 is a power supply potential, Vss1 is a ground potential, Qa11 and Qa21 are access transistors for accessing the memory cell, Qd11 and Qd21 are driver transistors for driving memory nodes to read/write memory cell data, Ra1 and Rb1 are load resistance elements for supplying charge to the memory nodes, and Ma1 and Mb1 are memory nodes for storing data.

Figure 2:
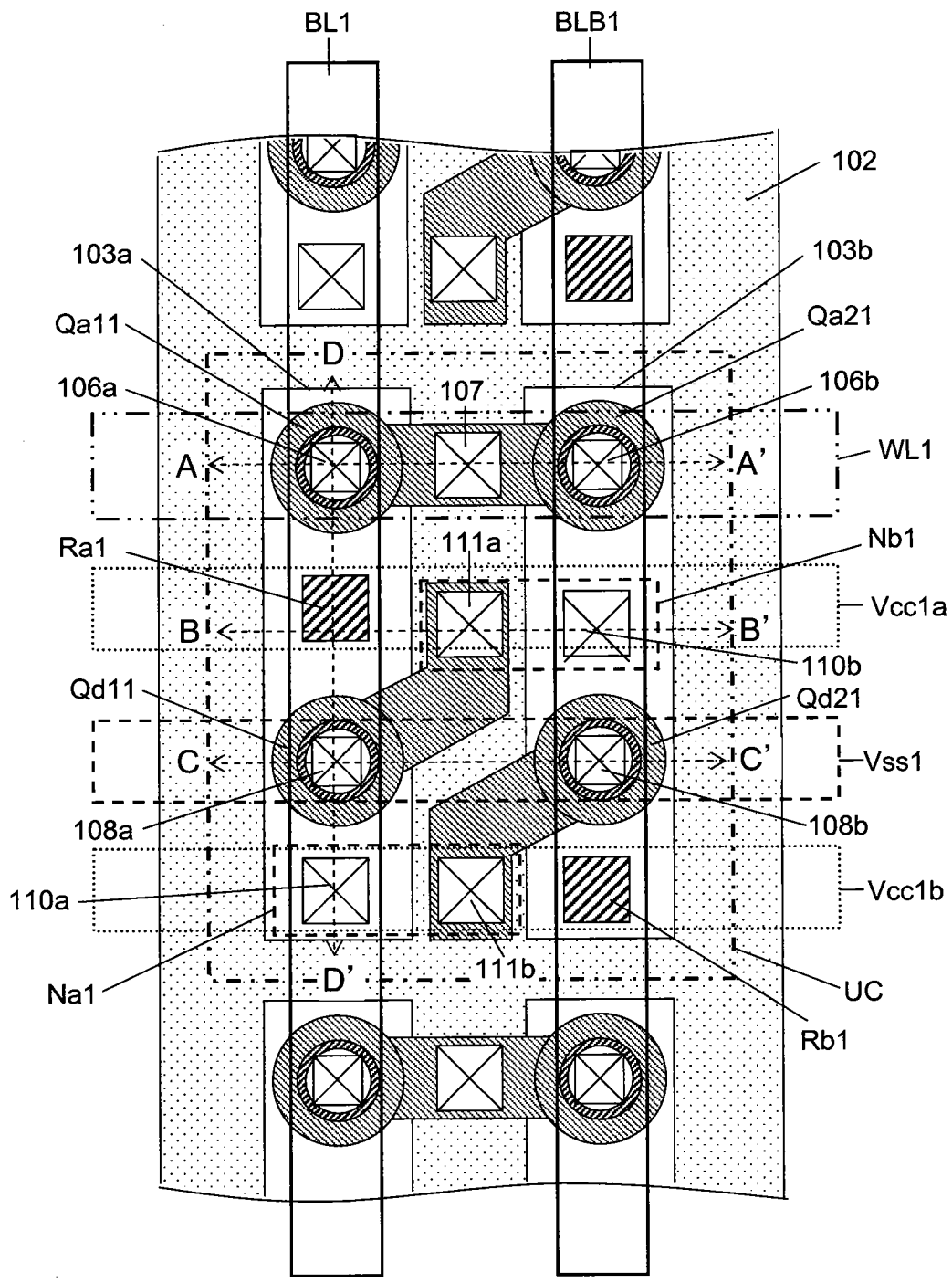
FIG. 2 is a plan view of an SRAM of Embodiment 1 of the present invention.

FIG. 2 is a plan view of an SRAM according to Embodiment 1 of the present invention. As shown in FIG. 2, a unit cell UC is repeatedly arranged in an SRAM cell array. FIGS. 3A to 3D show cross-sectional structures at the section lines A-A', B-B', C-C' and D-D' in the plan view of FIG. 2.

First, the layout of this embodiment will be described with reference to FIGS. 2 and 3A to 3D. A P-Well 101 is formed within an SRAM cell array. N+ diffusion layers (103a, 103b), which are planer silicon layers, on the substrate are separated by an element separator 102. The N+ diffusion layers (103a, 103b) function as memory nodes (Ma1, Mb1), respectively. Qa11 and Qa21 are access transistors, Qd11 and Qd21 are driver transistors, Ra1 and Rb1 are load resistance elements formed by contact plugs consisting of polysilicon or the like.

In this embodiment, one unit cell UC comprises transistors arranged in two rows and two columns on the substrate. Arranged in the first column, the access transistor Qa11 and driver transistor Qd11 are provided on the planar silicon layer 103a or the first memory node Ma1 in this order from the top in the figure. Arranged in the second column, the access transistor Qa21 and driver transistor Qd21 are provided on the planar silicon layer 103b or the second memory node Mb1 in this order from the top in the figure. The SRAM cell array of this embodiment is constructed by successively arranging the unit cells UC having such four transistors in the vertical direction in the figure.

As seen from FIGS. 2 and 3A to 3D, the N+ diffusion layer 103a functioning as the first memory node Ma1 is a common diffusion layer to the access transistor Qa11 and driver transistor Qd11 and the N+ diffusion layer 103b functioning as the second memory node Mb1 is a common diffusion layer to the access transistor Qa21 and driver transistor Qd21.

A contact 110a formed on the N+ diffusion layer 103a is connected to a contact 111b formed on a gate wire extending from the gate electrode of the driver transistor Qd21 by a node connection wire Na1. A contact 110b formed on the N+ diffusion layer 103b is connected to a contact 111a formed on a gate wire extending from the gate electrode of the driver transistor Qd11 by a node connection wire Nb1. A contact 106a formed in the upper part of the access transistor Qa11 is connected to the bit line BL1. A contact 106b formed in the upper part of the access transistor Qa21 is connected to the bit line BLB1. A contact 107 formed on a gate wire extending from the gate electrodes of the access transistors Qa11 and Qa21 is connected to the word line WL1. Furthermore, both contacts (108a, 108b) formed in the upper parts of the driver transistors (Qd11, Qd21) are connected to the ground potential wiring layer Vss1. The contact plugs Ra1 and Rb1 consisting of polysilicon or the like are connected to power supply potential wiring layers Vcc1a and Vcc1b, respectively.

It is desirable that the word line, bit lines, power supply potential wires, and ground potential wire are connected in a layer above the node connection wires or intra-memory cell wires so as to be shared with the other memory cells.

By way of example in a realizable configuration of the above hierarchical wiring, the node connection wire (Na1), node connection wire (Nb1), and ground potential wire Vss1 are provided in the lowermost layer, the power supply potential wires (Vcc1a, Vcc1b) are provided in a layer above them, the bit lines (BL1, BLB1) are provided in a more upper layer than them, and further, the word line (WL1) is provided in the uppermost layer so that undesired contact between the wires and contacts does not occur.

In the present invention, the source and drain of the transistors composing an SRAM cell are defined as follows. For the driver transistors (Qd11, Qd21), a diffusion layer formed in the upper part of a columnar semiconductor layer and connected to a ground voltage is defined as the source diffusion layer and a diffusion layer formed in the lower part of the columnar semiconductor layer is defined as the drain diffusion layer. For the access transistors (Qa11, Qa21), diffusion layers formed in the upper and lower parts of a columnar semiconductor layer serve either as a source or as a drain depending on the operation state. Here, the diffusion layer formed in the upper part of a columnar semiconductor layer is defined as the source diffusion layer and the diffusion layer formed in the lower part of the columnar semiconductor layer is defined as the drain diffusion layer for convenience.

Figure 3A:
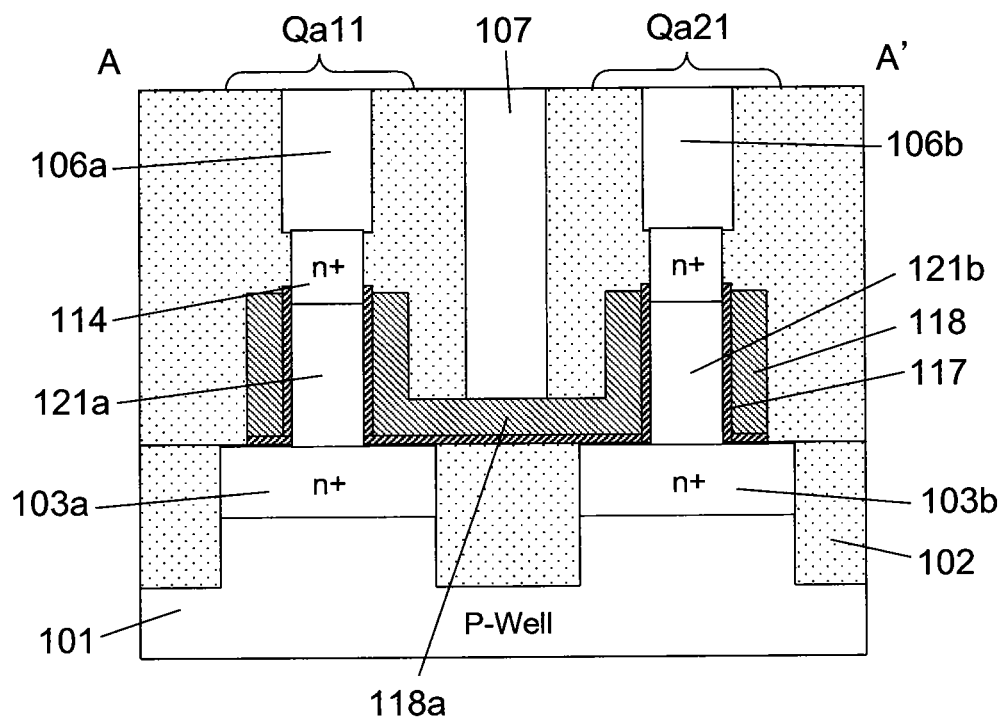
FIG. 3A is a cross-sectional view taken along line A-A' in FIG. 2 of the SRAM of Embodiment 1 of the present invention.

The structure of the SRAM cell according to the present invention will be described hereafter with reference to the cross-sectional structures in FIGS. 3A to 3D. As shown in FIG. 3A, a P-Well 101 is formed on a substrate within an SRAM cell array and N+ diffusion layers (103a, 103b) on the substrate are separated by an element separator 102. The N+ diffusion layers (103a, 103b) function as the memory nodes (Ma1, Mb1), respectively. A columnar silicon layer 121a forming the access transistor Qa11 is formed on the N+ diffusion layer 103a and a columnar silicon layer 121b forming the access transistor Qa21 is formed on the N+ diffusion layer 103b. A gate insulating film 117 and a gate electrode 118 are formed around each columnar silicon layer. An N+ diffusion layer 114 is formed in the upper parts of the columnar silicon layers by impurity implantation. Although not shown, a contact 106a formed on the access transistor Qa11 is connected to the bit line BL1 and a contact 106b formed on the access transistor Qa21 is connected to the bit line BLB1. A contact 107 formed on a gate wire 118a extending from the gate electrodes of the access transistors Qa11 and Qa21 is connected to the word line WL1.

Figure 3B:
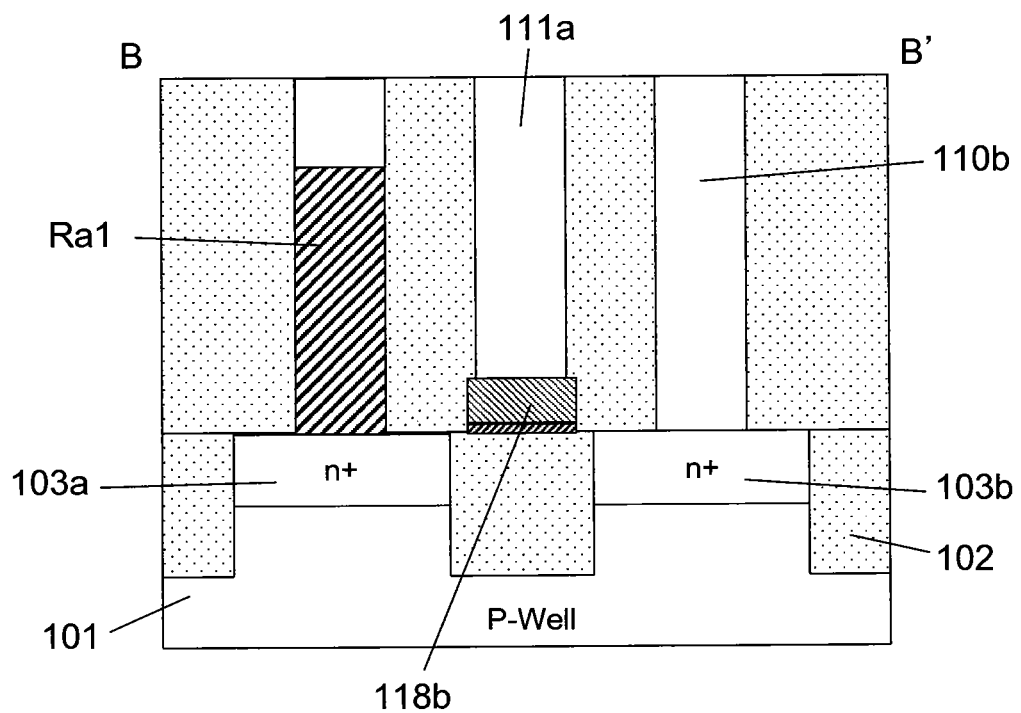
FIG. 3B is a cross-sectional view taken along line B-B' in FIG. 2 of the SRAM of Embodiment 1 of the present invention.

As shown in FIG. 3B, the P-Well 101 is formed on the substrate within the SRAM cell array and the N+ diffusion layers (103a, 103b) on the substrate are separated by the element separator 102. The N+ diffusion layers (103a, 103b) function as the memory nodes (Ma1, Mb1), respectively. A contact plug Ra1 consisting of polysilicon or the like and functioning as a load resistance element is formed on the planar silicon layer 103a. Although not shown, a contact 111a formed on a gate wire 118b extending from the gate electrode of the driver transistor Qd11 is connected to a contact 110b formed on the N+ diffusion layer 103b via a memory node connection wire Nb1.

Figure 3C:
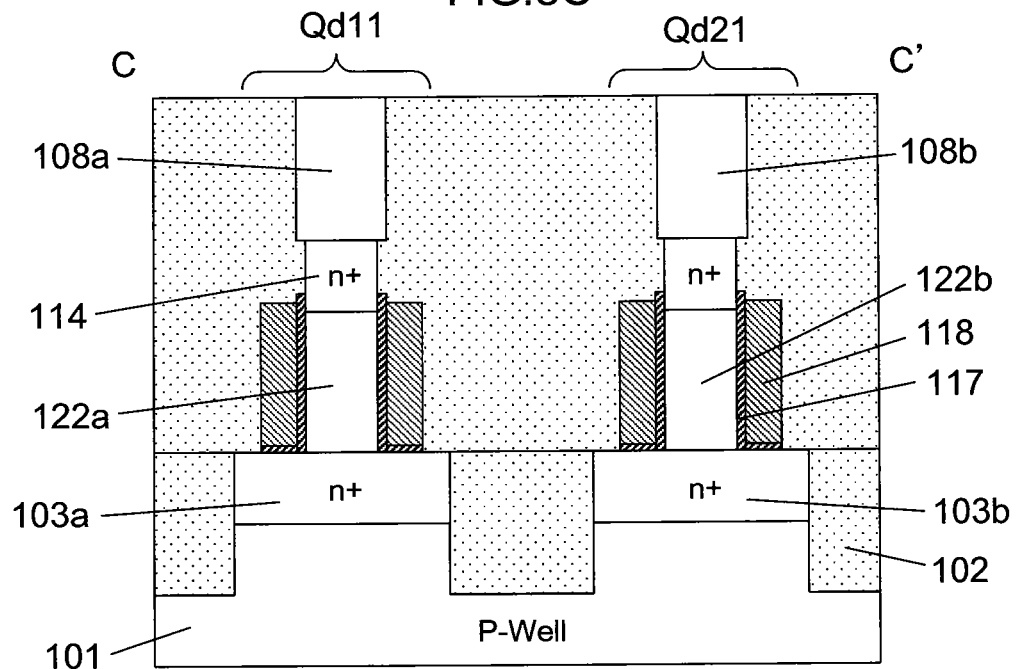
FIG. 3C is a cross-sectional view taken along line C-C' in FIG. 2 of the SRAM of Embodiment 1 of the present invention.

As shown in FIG. 3C, the P-Well 101 is formed on the substrate within the SRAM cell array and the N+ diffusion layers (103a, 103b) on the substrate are separated by the element separator 102. The N+ diffusion layers (103a, 103b) function as the memory nodes (Ma1, Mb1), respectively. A columnar silicon layer 122a forming the driver transistor Qd11 is formed on the N+ diffusion layer 103a and a columnar silicon layer 122b forming the driver transistor Qd21 is formed on the N+ diffusion layer 103b. A gate insulating film 117 and a gate electrode 118 are formed around each columnar silicon layer. An N+ diffusion layer 114 is formed in the upper parts of the columnar silicon layers by impurity implantation. Although not shown, both contacts (108a, 108b) formed on the driver transistors (Qd11, Qd21) are connected to the ground potential Vss1 via a wiring layer.

Figure 3D:
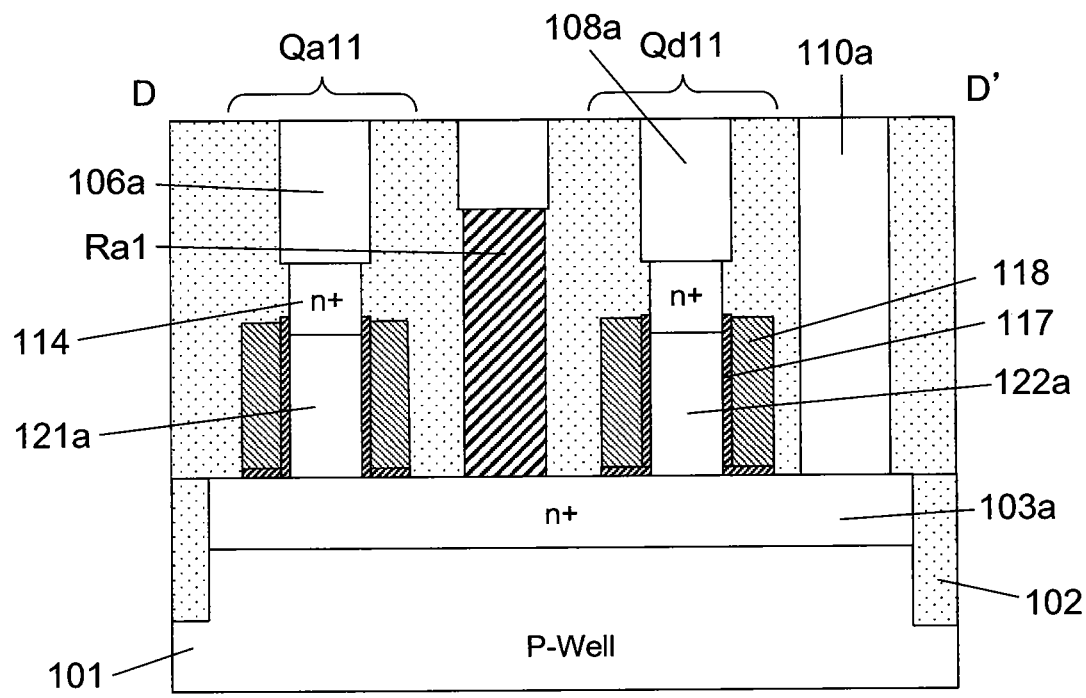
FIG. 3D is a cross-sectional view taken along line D-D' in FIG. 2 of the SRAM of Embodiment 1 of the present invention.

As shown in FIG. 3D, the P-Well 101 is formed on the substrate within the SRAM cell array and the N+ diffusion layer 103a on the substrate is separated by the element separator 102. The N+ diffusion layer 103a functions as the memory node Ma1. A columnar silicon layer 121a composing the access transistor Qa11 and a columnar silicon layer 122a composing the driver transistor Qd11 are formed on the N+ diffusion layer 103a. A gate insulating film 117 and a gate electrode 118 are formed around each columnar silicon layer. An N+ drain diffusion layer 114 is formed in the upper part of each columnar silicon layer by impurity implantation. Although not shown, a contact 106a formed on the access transistor Qa11 is connected to the bit line BL1, a contact 108a formed on the driver transistor Qd11 is connected to the ground potential wire Vss1, and the polysilicon plug Ra1 is connected to the power supply potential wire Vcc1a. Furthermore, a contact 110a on the drain diffusion layer is connected to a contact 111b formed on a gate wire extending from the gate electrode of the driver transistor Qd21 via a memory node connection wire Na1.

Figure 17A:
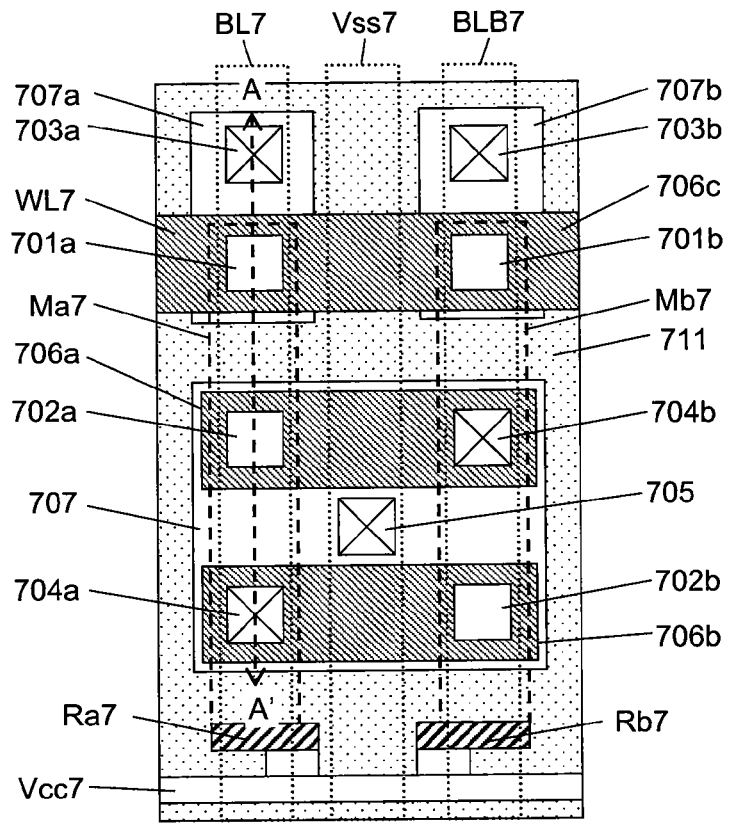
FIG. 17A is a plan view of a prior art SRAM using SGTs.
Figure 17B:
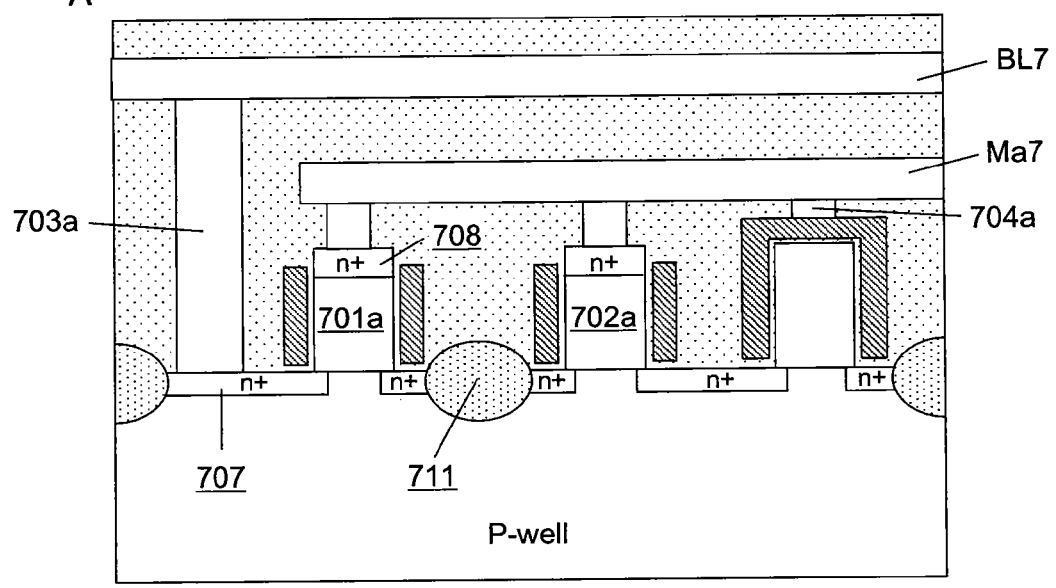
FIG. 17B is a cross-sectional view of the SRAM of the prior art.

The conventional SRAM cell shown in FIG. 17A and FIG. 17B are composed of three diffusion layers (707, 707*a*, 707*b*). Therefore, the reduction of cell areas is limited. However, in the present invention, the SRAM cell is composed of two N+ diffusion layers (103*a*, 103*b*) forming memory nodes in the present invention. Therefore, the present invention leads to highly efficient use of the area of diffusion layers, allowing for a smaller SRAM area. Furthermore, the diffusion layers have a simple rectangular shape and, therefore, the shape of its patterns can easily be corrected by OPC (optical proximity correction). This is a layout that is suitable for attaining a small SRAM cell area. In addition, the load resistance elements (Ra1, Rb1) are formed by contact plugs on the diffusion layers (103*a*, 103*b*) functioning as memory nodes instead of being provided in a polysilicon wiring layer as in the prior art embodiment. Therefore, a resistance element can be formed in a space for two contacts, whereby an SRAM cell having a small area can be formed.

In this embodiment, the load resistance elements are formed by contact plugs consisting of polysilicon. The resistance of the load resistance elements can be controlled by the impurity concentration upon formation of a polysilicon film. The load resistance elements can be formed by filling vias between contacts or wiring layers with a highly resistant metal or semiconductor in place of polysilicon.

The contact plugs are not restricted to the layout shown in the embodiment of the present invention and can be provided in a layout optimized by fine adjustment of the SRAM cell layout so as to design an SRAM cell having a small area.

An example of a method of manufacturing the semiconductor memory device of the present invention will be described hereafter with reference to FIGS. 4A to 11B. In each figure, A is a plan view and B is a cross-sectional view at a line A-A'.

Figure 4A:
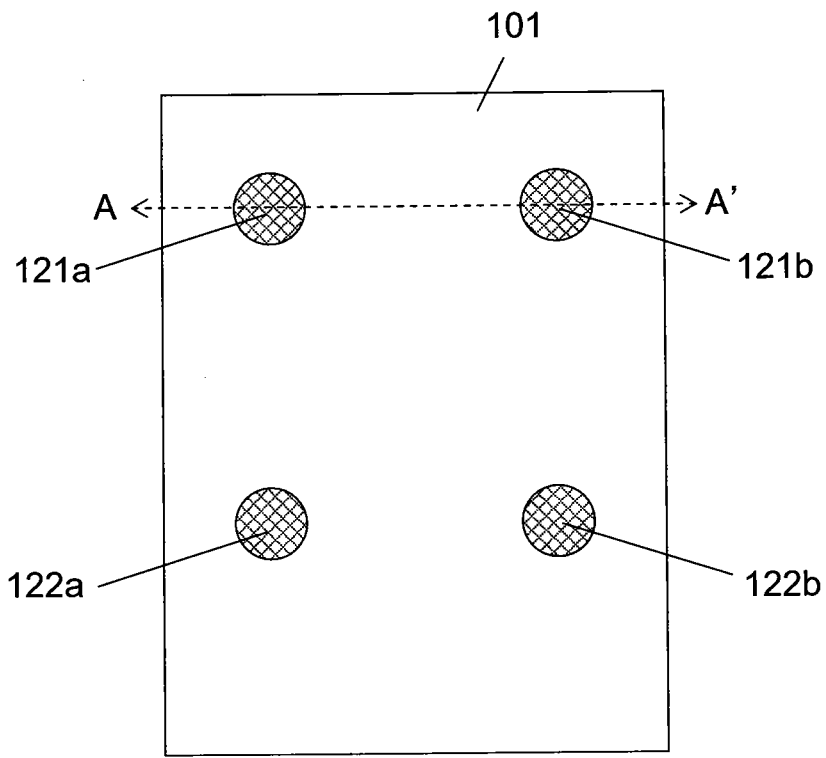
FIG. 4A is a plan view showing a manufacturing process (1) of the SRAM of Embodiment 1 of the present invention.
Figure 4B:
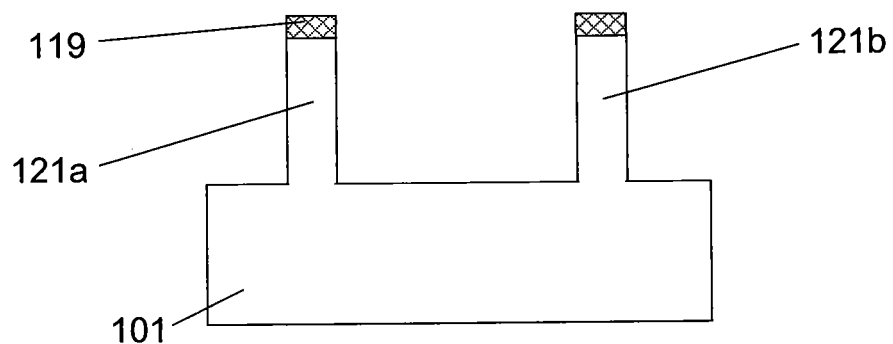
FIG. 4B is a cross-sectional view showing the manufacturing process (1) of the SRAM of Embodiment 1 of the present invention.

As shown in FIG. 4A and FIG. 4B, a silicon nitride film or the like is formed on a substrate, a pattern for columnar silicon layers is formed by lithography, and etching is performed to form a mask layer 119 and columnar silicon layers (121*a*, 121*b*, 122*a*, 122*b*).

Figure 5A:
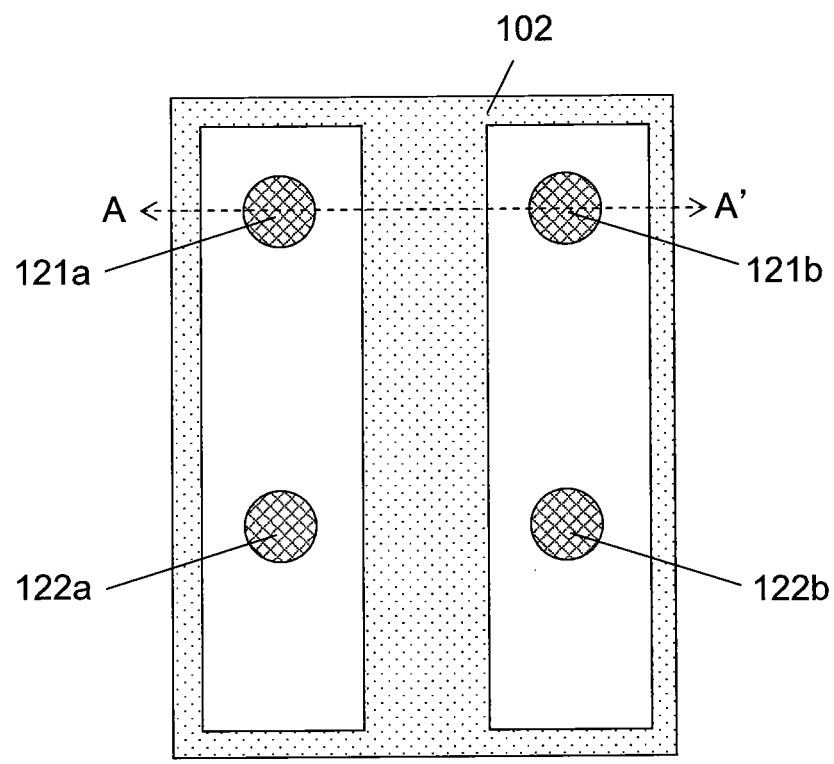
FIG. 5A is a plan view showing a manufacturing process (2) of the SRAM of Embodiment 1 of the present invention.
Figure 5B:
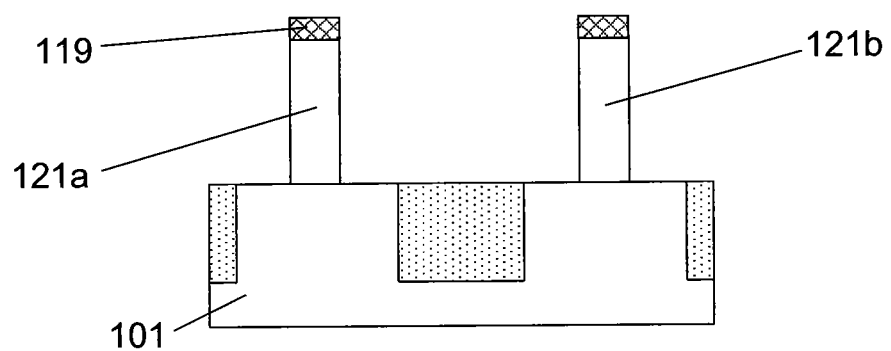
FIG. 5B is a cross-sectional view showing the manufacturing process (2) of the SRAM of Embodiment 1 of the present invention.

As shown in FIG. 5A and FIG. 5B, an element separator 102 is formed. The element separator is formed by first etching a groove pattern, filling the groove pattern with an oxide film by CVD or the like, and removing any extra oxide film on the substrate by dry or wet etching.

Figure 6A:
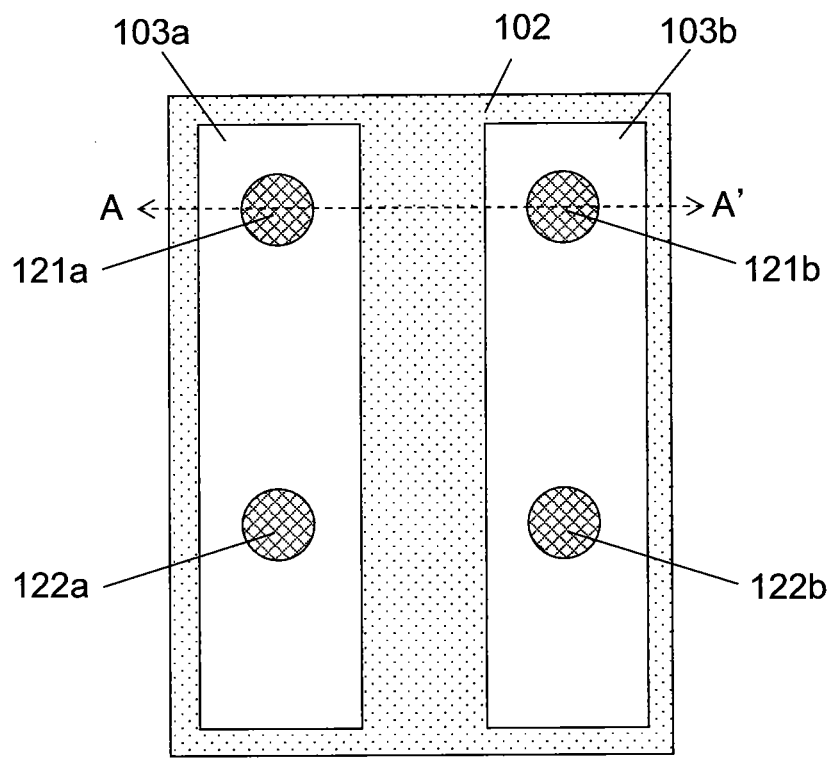
FIG. 6A is a plan view showing a manufacturing process (3) of the SRAM of Embodiment 1 of the present invention.
Figure 6B:
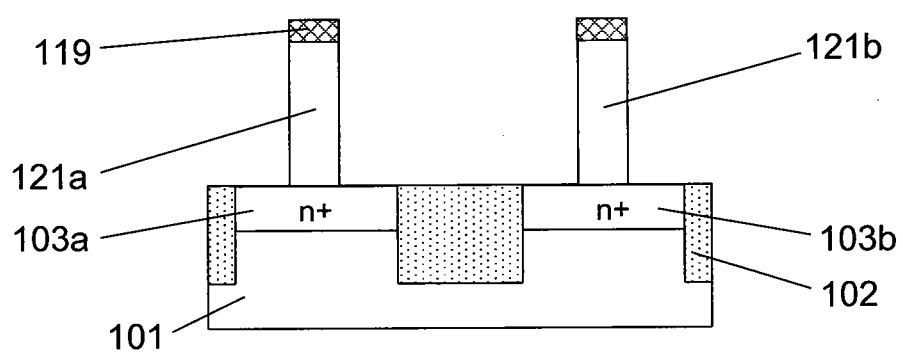
FIG. 6B is a cross-sectional view showing the manufacturing process (3) of the SRAM of Embodiment 1 of the present invention.

As shown in FIG. 6A and FIG. 6B, an impurity is introduced by ion implantation to form N+ diffusion layers (103*a*, 103*b*) in the lower parts of the columnar silicon layers as the planar silicon layer.

Figure 7A:
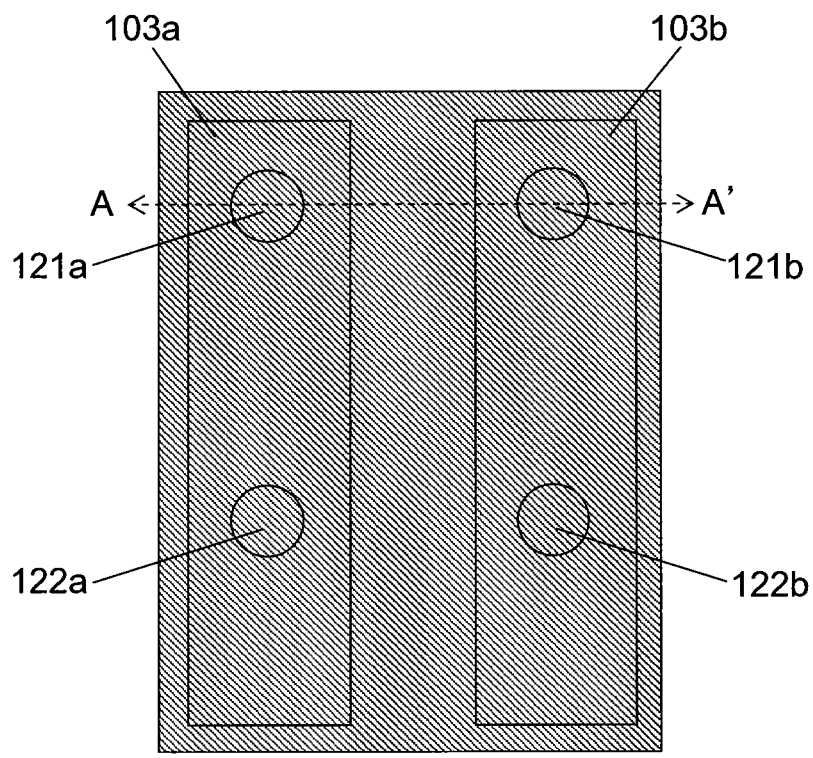
FIG. 7A is a cross-sectional view showing a manufacturing process (4) of the SRAM of Embodiment 1 of the present invention.
Figure 7B:
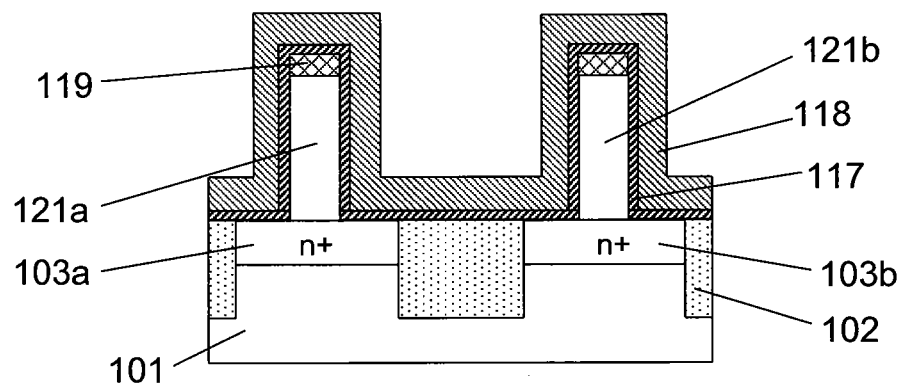
FIG. 7B is a cross-sectional view showing the manufacturing process (4) of the SRAM of Embodiment 1 of the present invention.

As shown in FIG. 7A and FIG. 7B, a gate insulating film 117 and a gate conductive film 118 are formed.

Figure 8A:
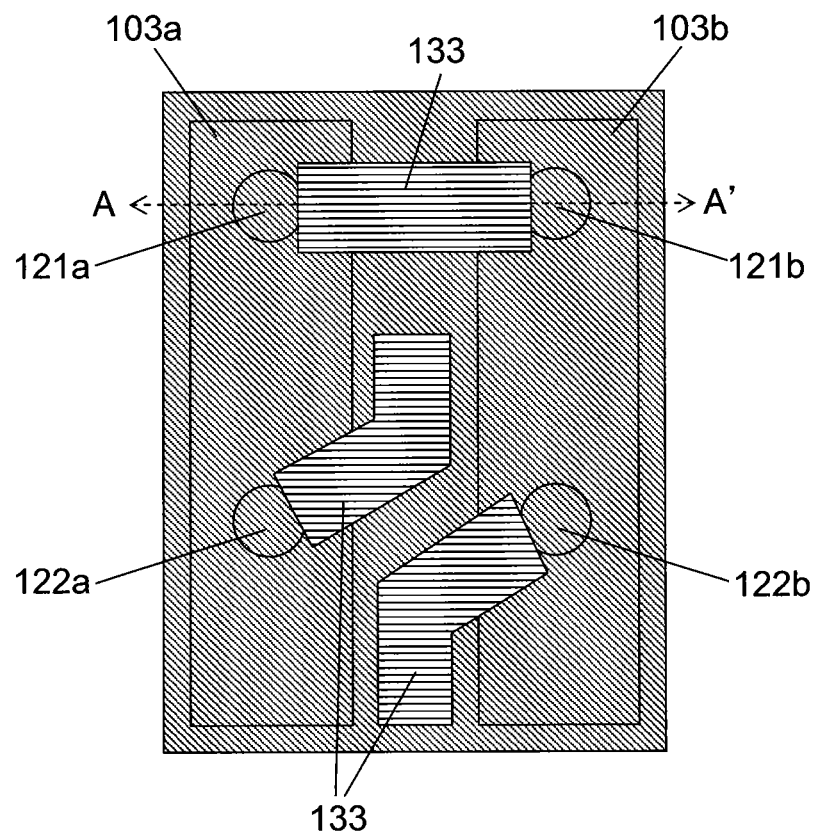
FIG. 8A is a plan view showing a manufacturing process (5) of the SRAM of Embodiment 1 of the present invention.
Figure 8B:
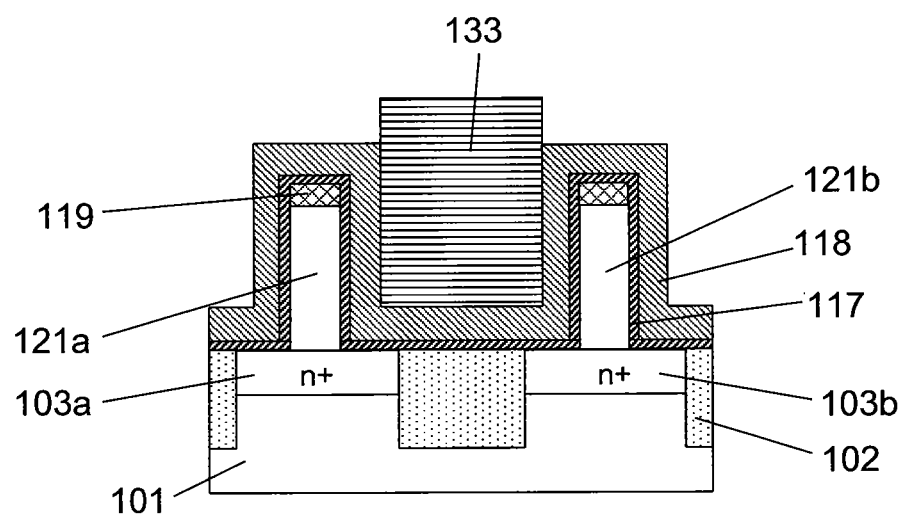
FIG. 8B is a cross-sectional view showing the manufacturing process (5) of the SRAM of Embodiment 1 of the present invention.

As shown in FIG. 8A and FIG. 8B, a gate wire pattern is formed by lithography using a resist 133.

Figure 9A:
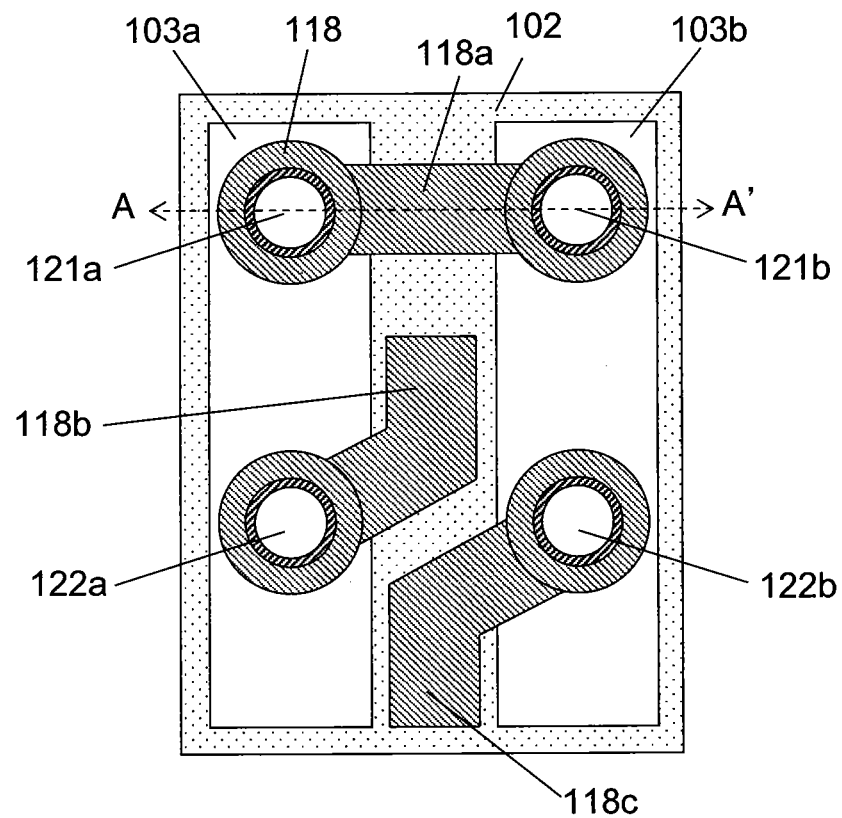
FIG. 9A is a plan view showing a manufacturing process (6) of the SRAM of Embodiment 1 of the present invention.
Figure 9B:
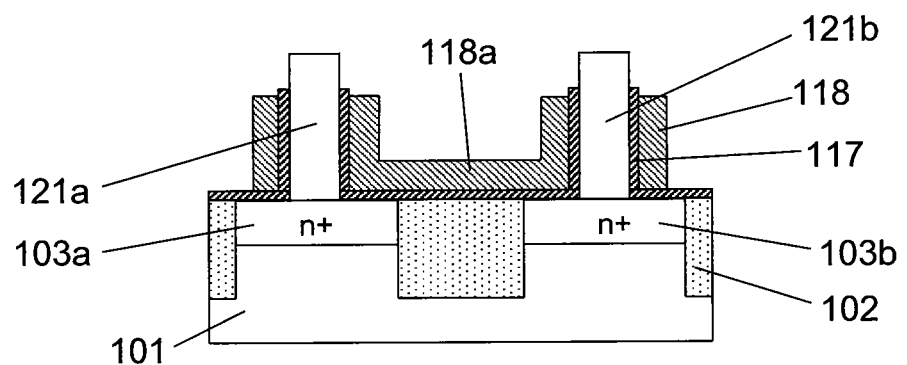
FIG. 9B is a cross-sectional view showing the manufacturing process (6) of the SRAM of Embodiment 1 of the present invention.

As shown in FIG. 9A and FIG. 9B, the gate conductive film 117 and gate insulating film 118 are etched using the resist 133 as a mask and the resist 133 is removed. Then, gate wires (118*a* to 118*c*) are formed. Then, a mask 119 on the pillars is removed.

Figure 10A:
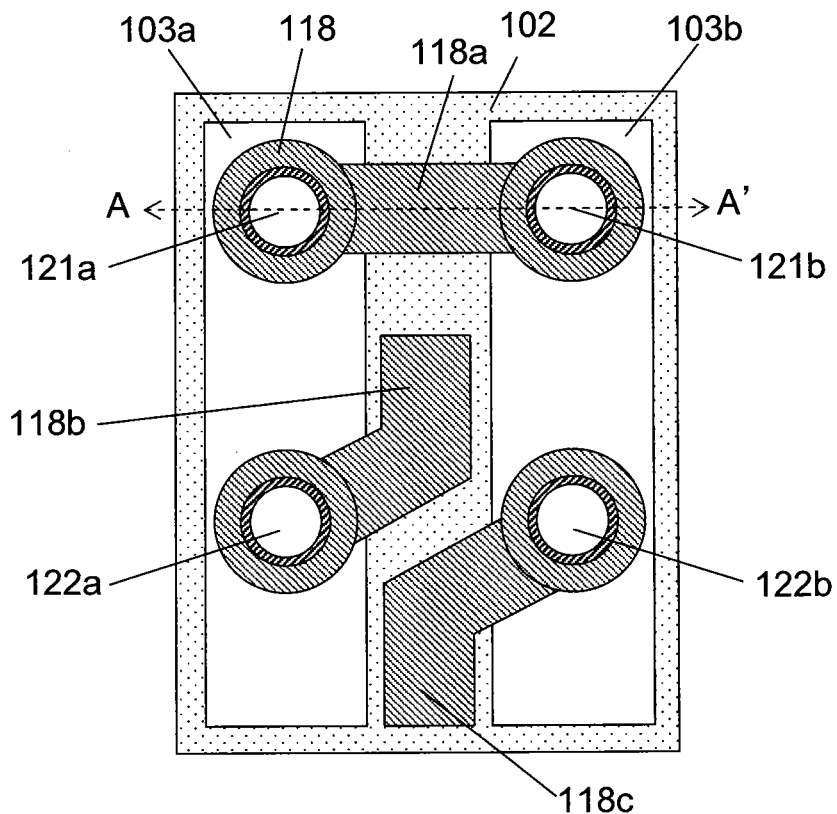
FIG. 10A is a plan view showing a manufacturing process (7) of the SRAM of Embodiment 1 of the present invention.
Figure 10B:
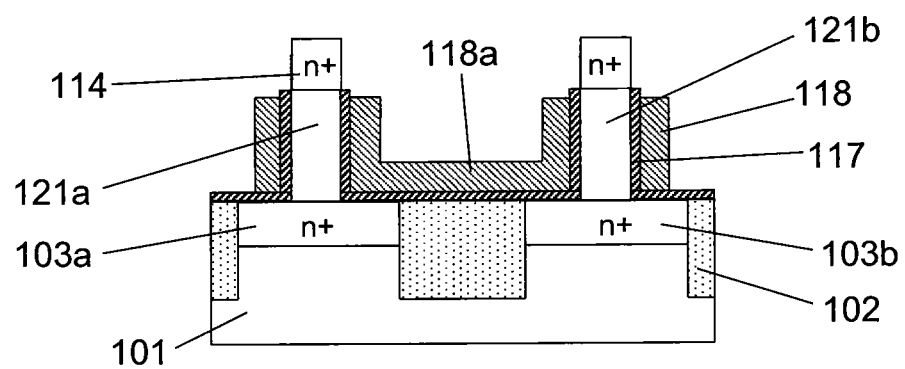
FIG. 10B is a cross-sectional view showing the manufacturing process (7) of the SRAM of Embodiment 1 of the present invention.

As shown in FIG. 10A and FIG. 10B, an impurity is introduced by ion implantation to form an N+ diffusion layer 114 in the upper parts of the columnar silicon layers.

Figure 11A:
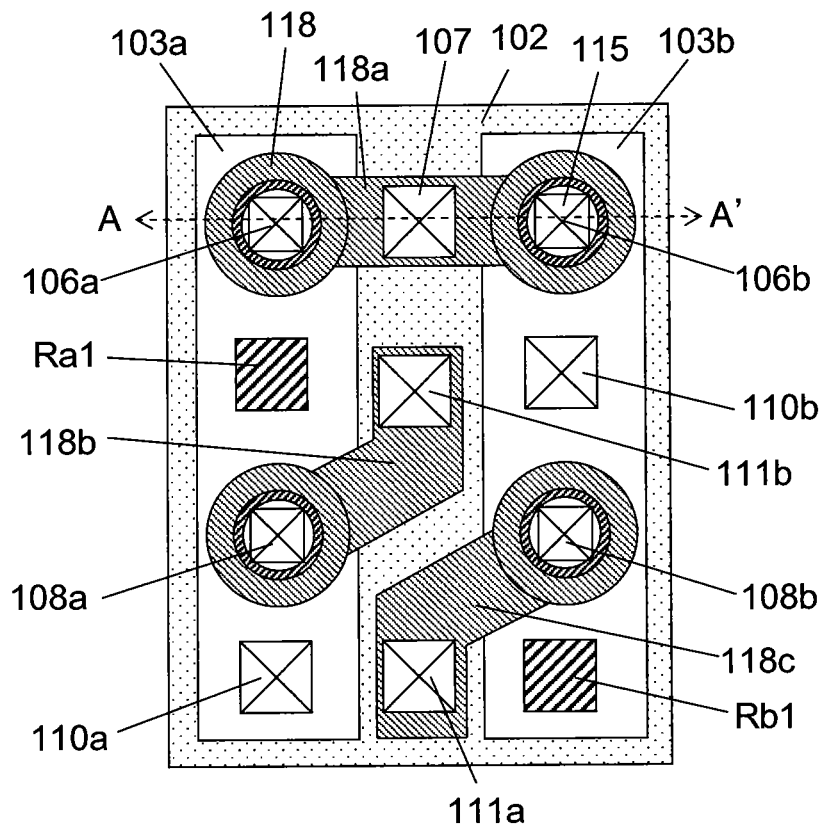
FIG. 11A is a plan view showing a manufacturing process (8) of the SRAM of Embodiment 1 of the present invention.
Figure 11B:
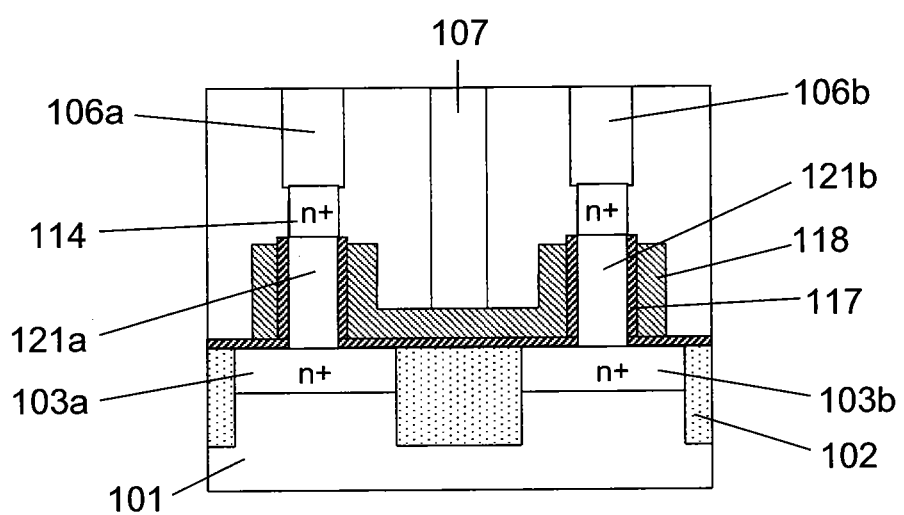
FIG. 11B is a cross-sectional view showing the manufacturing process (8) of the SRAM of Embodiment 1 of the present invention.

As shown in FIG. 11A and FIG. 11B, contact plugs (Ra1, Rb1) consisting of polysilicon or the like are formed as load resistance elements. Then, normal contacts (107, 106*a*, 108*a*, 110*a*, 111*a*, 106*b*, 108*a*, 110*a*, 111*a*) are formed.

Embodiment 2

Figure 12:
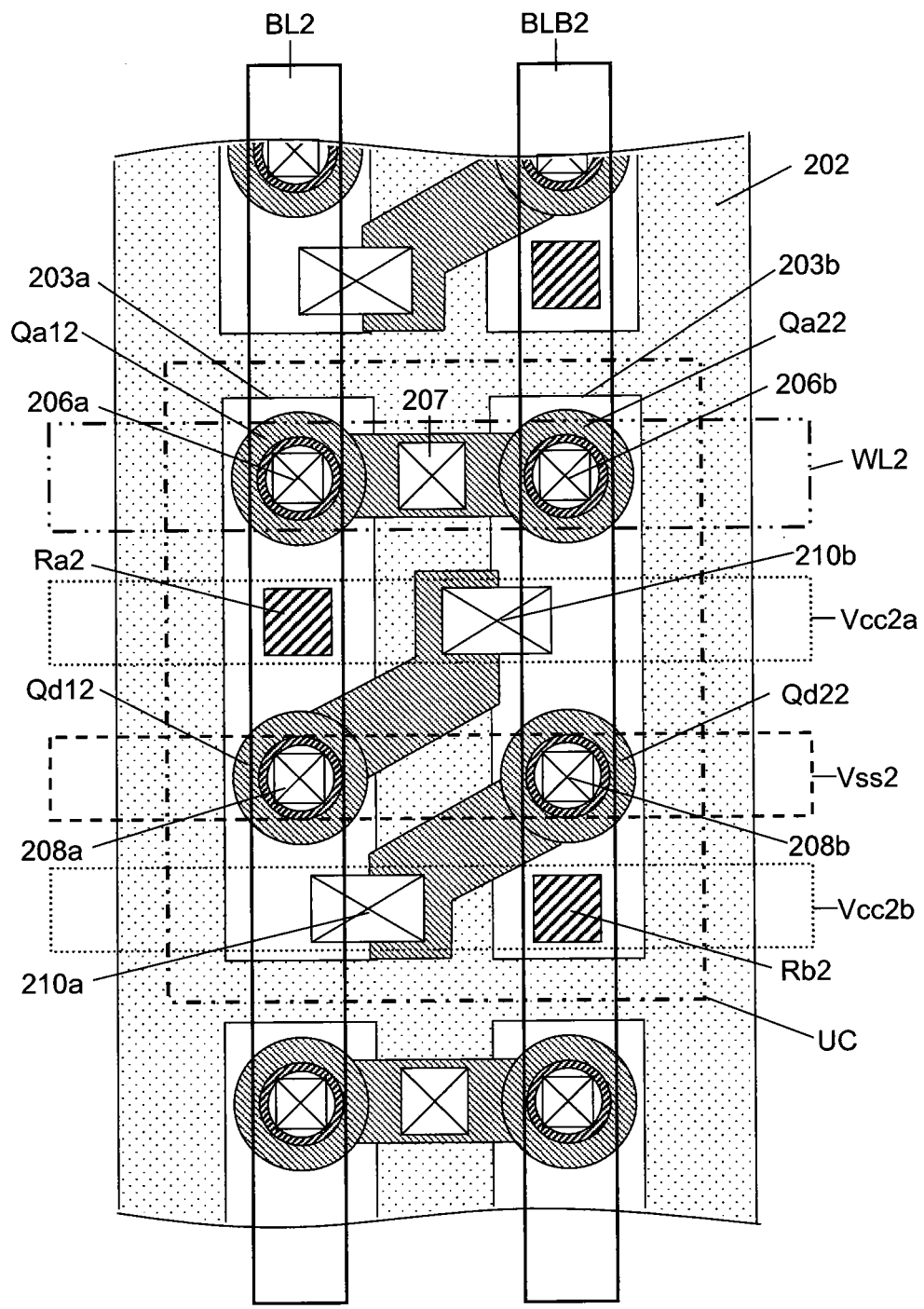
FIG. 12 is a plan view of an SRAM of Embodiment 2 of the present invention.

FIG. 12 is a plan view showing the SRAM according to Embodiment 2. This embodiment is different from Embodiment 1 in the following point. In the present embodiment, an N+ diffusion layer 203*a* that is a memory node (Ma1) and the gate wire extending from the gate electrode of the driver transistor Qd22 are connected by a common contact 210*a* extending over them. An N+ diffusion layer 203*b* that is a memory node (MM) and the gate wire extending from the gate electrode of the driver transistor Qd12 are connected by a common contact 210*b* extending over them. The gate and memory node are connected by a contact, not by a wiring layer, as described above; the number of contacts in an SRAM cell will be reduced, whereby the cell area can be reduced by adjusting the positions of columnar silicon layers and contacts.

As mentioned in Embodiment 1, the word line, bit lines, power supply potential wires, and ground potential wire are desirably provided in a layer above the node connection wires or intra-memory cell wires so as to be shared with the other memory cells. In this embodiment, the node connection wires are formed by contacts.

Except for the above point, the same structure as in Embodiment 1 is employed and further explanation is omitted.

Embodiment 3

Figure 13:
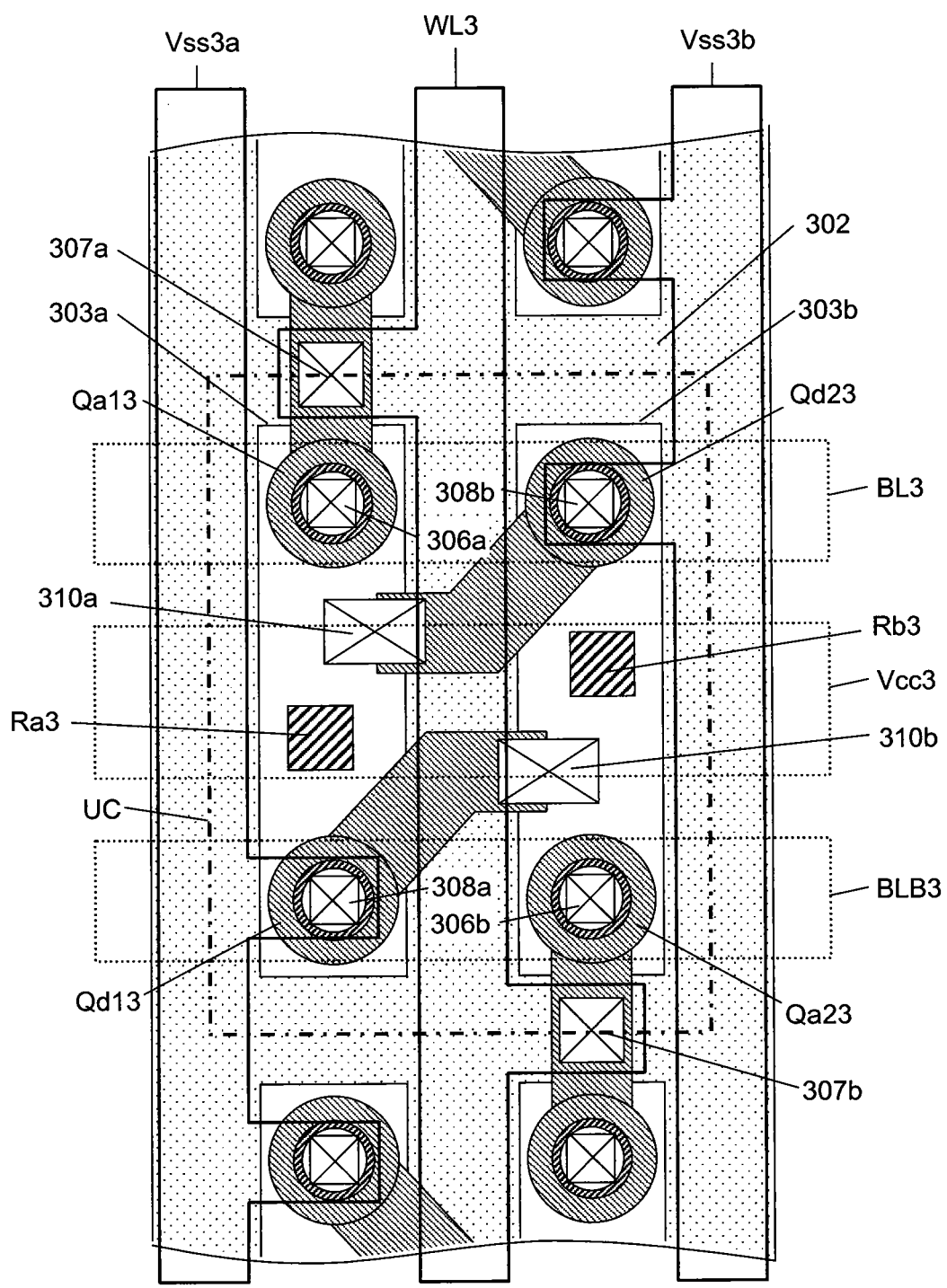
FIG. 13 is a plan view of an SRAM of Embodiment 3 of the present invention.

FIG. 13 is a plan view of the SRAM according to Embodiment 3. In this embodiment, the SRAM cell array is constructed in the following manner: the transistors positioned in the first column of a unit cell UC in FIG. 13 have the same positional arrangement as the transistors positioned in the second column of an immediately upper or lower memory cell and the transistors positioned in the second column of the unit cell UC have the same positional arrangement as the transistors positioned in the first column of an immediately upper or lower memory cell with respect to the unit cell UC.

As mentioned in Embodiment 1, the word line, bit lines, power supply potential wires, and ground potential wire are desirably provided in a layer above the node connection wires or intra-memory cell wires so as to be shared with the other memory cells. In this regard, by way of example in a realizable configuration of the hierarchical wiring, the node connection wires (310*a*, 310*b*) consisting of contacts are provided in a lower layer, the word line (WL3) and ground potential wires (Vss3*a*, Vss3*b*) are provided in a middle layer, and the bit lines (BL3, BLB3) and power supply potential wire Vcc3 are provided in an upper layer. In this embodiment, the node connection wires are formed by contacts so that undesired contact between the wires and contacts does not occur.

Except for the above point, the same structure as in Embodiment 1 is employed and further explanation is omitted.

Embodiment 4

Figure 14:
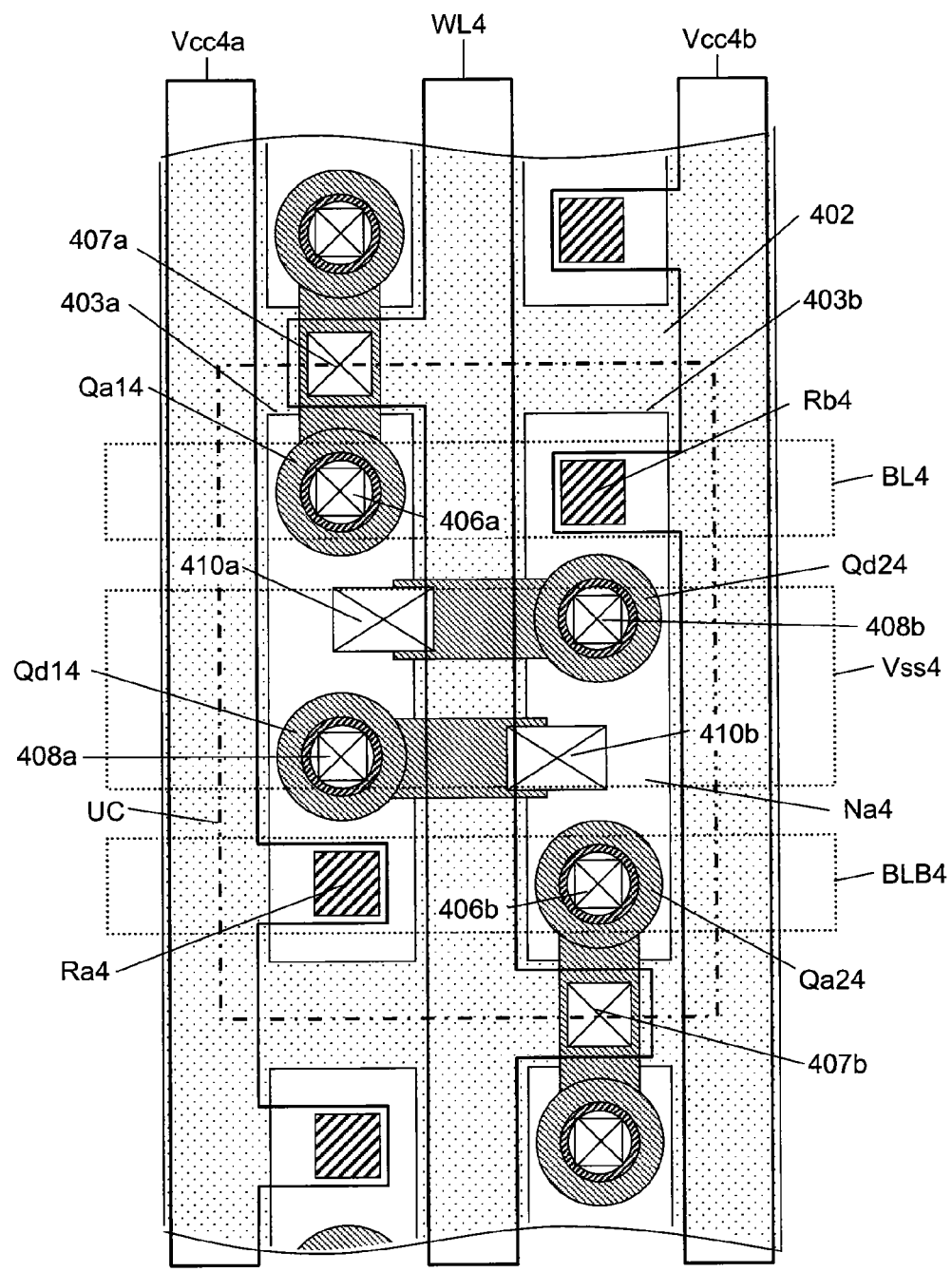
FIG. 14 is a plan view of an SRAM of Embodiment 4 of the present invention.

FIG. 14 is a plan view showing the SRAM according to Embodiment 4 of the present application. This embodiment is different from Embodiment 3 in that the driver transistor Qd14 and polysilicon plug Ra4 are switched in position and the driver transistor Qd24 and polysilicon plug Rb4 are switched in position. Therefore, the gate wire layout is rectangular and easy to form. Furthermore, in this embodiment, the power supply wires (Vcc4*a*, Vcc4*b*) are parallel to the word line WL4 and the ground wire Vss4 is parallel to the bit lines (BL4, BLB4).

As mentioned in Embodiment 1, the word line, bit lines, power supply potential wires, and ground potential wire are desirably provided in a layer above the node connection wires or intra-memory cell wires so as to be shared with the other memory cells. In this regard, the same configuration as in Embodiment 3 can be attained as an exemplary hierarchical wiring configuration. In this embodiment, the node connection wires are formed by contacts.

Except for the above point, the same structure as in Embodiment 1 is employed and further explanation is omitted.

Embodiment 5

Figure 15:
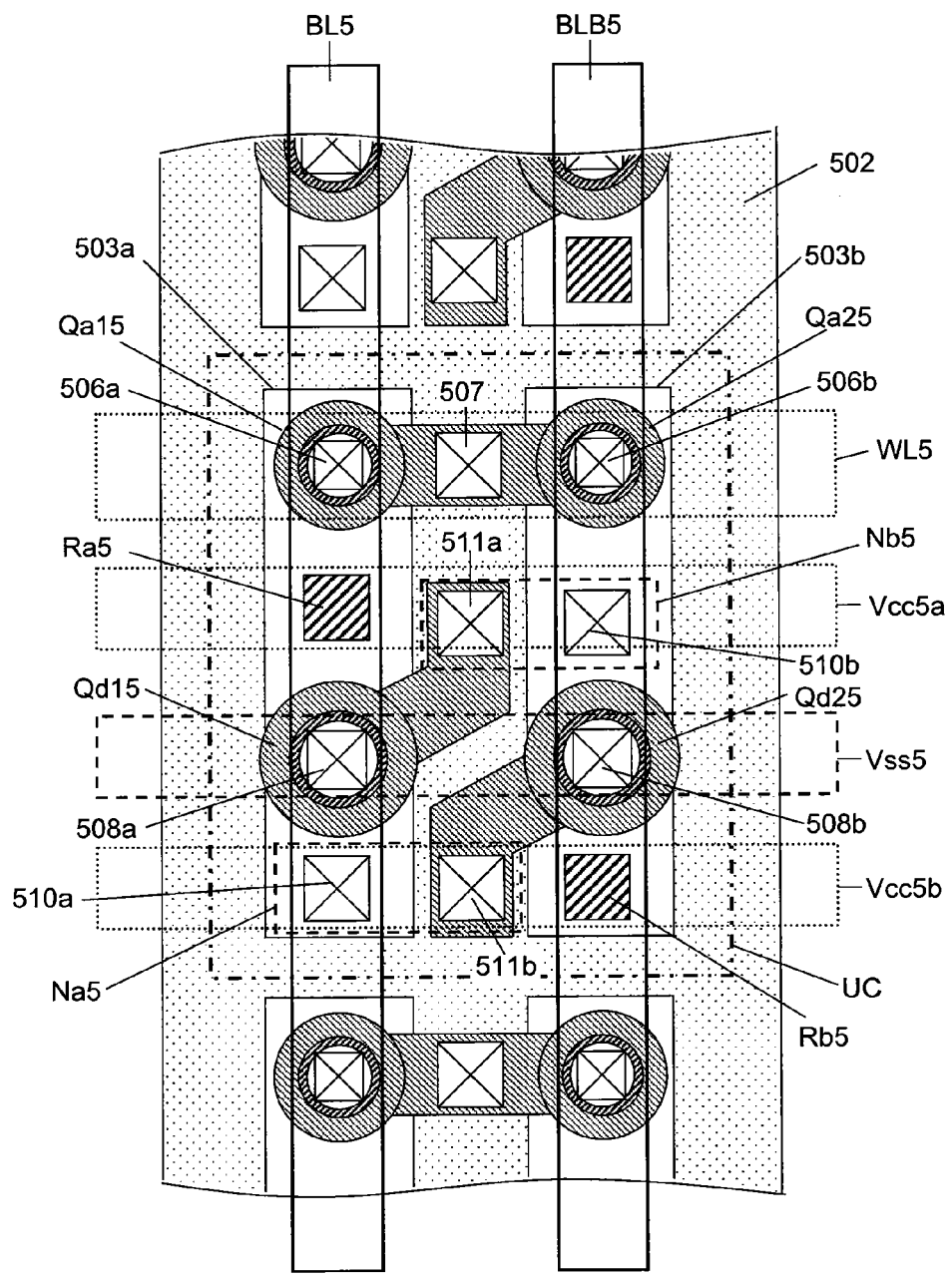
FIG. 15 is a plan view of an SRAM of Embodiment 5 of the present invention.

FIG. 15 shows a plan view showing the SRAM cell of Embodiment 5. This embodiment is different from Embodiment 1 in that shapes of the columnar silicon layers forming access transistors are different and the sizes of the columnar silicon layers forming driver transistors are different. In an E/R 4T-SRAM, the reading margin can be improved by enhancing the driving performance of the driver transistors compared with the access transistors. With the circumference of the columnar silicon layers forming driver transistors being increased as in this embodiment, the driving performance of the driver transistors can be enhanced compared with the access transistors, whereby the reading margin can be expanded.

On the other hand, for improving the writing margin, it is effective to enhance the driving performance of the access transistors compared with the driver transistors. In such a case, the circumference of the columnar silicon layers forming access transistors is increased to enhance the driving performance of the access transistors compared with the driver transistors, whereby the writing margin can be improved.

However, when the columnar silicon layers have a larger diameter, the channel control by the gate is diminished and the short channel effect is increased, increasing off-leak of the transistors. Therefore, the circumference of the columnar silicon layers should be increased with consideration of trade-off between improvement in the transistor performance as a result of increase in the channel width and increase in the off-leak as a result of the short channel effect. The columnar silicon layers are not necessarily circular and can be oval or rectangular to increase their circumference. In such a case, the transistor performance can be improved while preventing the short channel effect.

As described above, the access transistors and driver transistors can be modified in shape to adjust various SRAM characteristics.

As mentioned in Embodiment 1, the word line, bit lines, power supply potential wires, and ground potential wire are desirably provided in a layer above the node connection wires or intra-memory cell wires so as to be shared with the other memory cells. In this regard, the same configuration as in Embodiment 1 can be attained as an exemplary hierarchical wiring configuration.

Except for the above point, the same structure as in Embodiment 1 is employed and further explanation is omitted.

Embodiment 6

Figure 16:
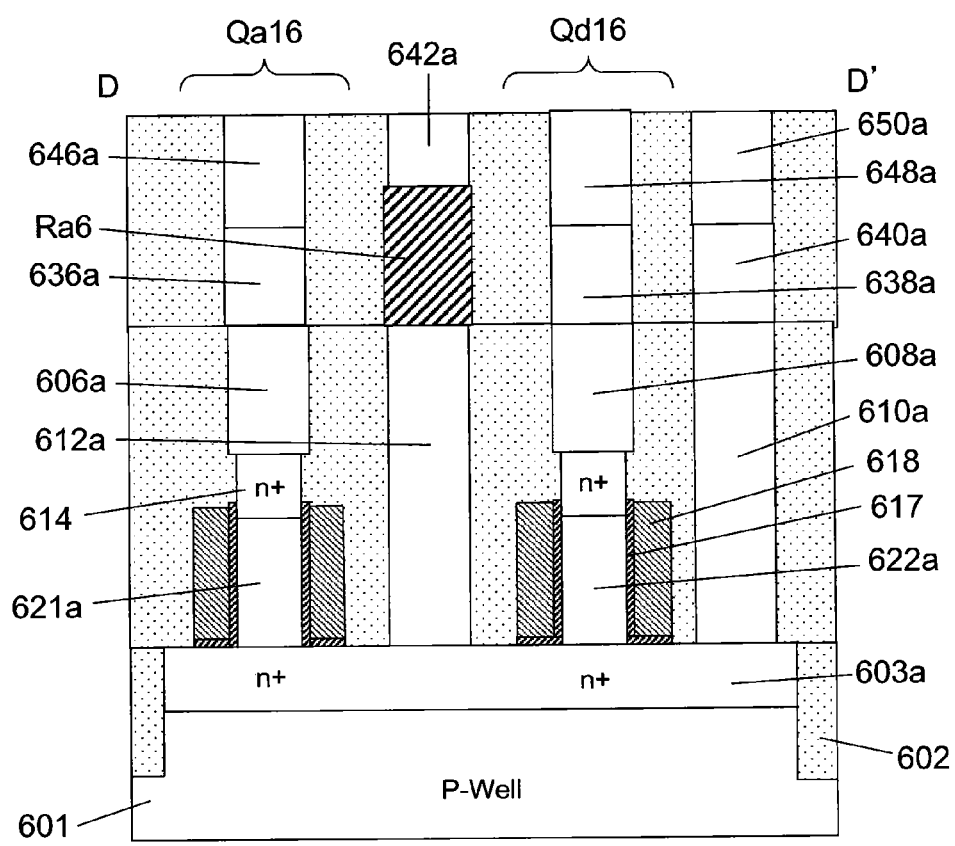
FIG. 16 is a cross-sectional view of an SRAM of Embodiment 6 of the present invention.

In the above embodiments, the load resistance elements are formed by contact plugs consisting of polysilicon or the like. In practice, the load resistance elements can be formed by vias or a wiring layer connecting wires in a layer above the contacts. FIG. 16 is a cross-sectional view at the section line D-D' in FIG. 2, showing the load resistance elements provided between first wiring layers, instead of between contact layers in Embodiment 1.

In FIG. 16, first wiring layers (636*a*, 638*a*, 640*a*) are formed on the contacts (606*a*, 612*a*, 608*a*, 610*a*) and first wiring vias (646*a*, 642*a*, 648*a*, 650*a*) are formed on the first wiring layers. A load resistance element Ra6 is formed between the first wiring layers. In Embodiment 6, the load resistance element is formed between the first wiring layers. However, the position of the load resistance element is not restricted to between the first wiring layers.

Except for the above point, the same structure as in Embodiment 1 is employed and further explanation is omitted.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A semiconductor memory device comprising a static memory cell composed of four MOS transistors and two load resistance elements arranged on a substrate, wherein:
    the four MOS transistors function as first and second NMOS access transistors for accessing the memory cell and as first and second NMOS driver transistors for driving memory nodes to write and read memory cell data, wherein the first and second NMOS access transistors each comprise an N-type first diffusion layer, a first columnar semiconductor layer and an N-type second diffusion layer arranged vertically in tiers in an ascending order on the substrate, the first columnar semiconductor layer being formed with a first gate surrounding the first columnar semiconductor layer, and wherein the first and second NMOS driver transistors comprise an N-type third diffusion layer, a second columnar semiconductor layer and an N-type fourth diffusion layer arranged vertically in tiers in an ascending order on the substrate, the second columnar semiconductor layer being formed with a second gate surrounding the second columnar semiconductor layer;
    the first NMOS access transistor and first NMOS driver transistor adjoin each other;
    the second NMOS access transistor and second NMOS driver transistor adjoin each other;
    the first diffusion layer formed at a bottom of the first NMOS access transistor is connected directly to the third diffusion layer formed at a bottom of the first NMOS driver transistor, wherein the directly connected first and third diffusion layers, formed at the bottoms of the first NMOS access transistor and the first NMOS driver transistor, function as a first memory node for storing data;
    the first diffusion layer formed at a bottom of the second NMOS access transistor is connected directly to the third diffusion layer formed at a bottom of the second NMOS driver transistor, wherein the directly connected first and third diffusion layers, formed at the bottoms of the second NMOS access transistor and the second NMOS driver transistor, function as a second memory node for storing data; and
    the two load resistance elements are provided, respectively, on the directly connected first and third diffusion layers, formed at the bottoms of the first NMOS access transistor and the first NMOS driver transistor, functioning as the first memory node and on the directly connected first and third diffusion layers, formed at the bottoms of the second NMOS access transistor and the second NMOS driver transistor, functioning as the second memory node.

2. The semiconductor memory device according to claim 1, wherein the two load resistance elements are formed, respectively, with a first contact plug formed of semiconductor or metal which is formed on the diffusion layers functioning as the first memory node and with a second contact plug formed of semiconductor or metal which is formed on the diffusion layers functioning as the second memory node.

3. The semiconductor memory device according to claim 1, wherein at least one of contacts formed on gate wires extending from the gate electrodes of the first and second NMOS access transistors is a common contact also used as a contact formed on a gate wire extending from a gate electrode of an NMOS access transistor of an adjoining memory cell.

4. The semiconductor memory device according to claim 1, wherein:
a gate wire extending from the gate of the first NMOS driver transistor formed on the first diffusion layer functioning as the first memory node is connected by a common contact shared with the second diffusion layer functioning as the second memory node; and
a gate wire extending from the gate of the second NMOS driver transistor formed on the second diffusion layer functioning as the second memory node is connected by a common contact shared with the first diffusion layer functioning as the first memory node.

5. The semiconductor memory device according to claim 1, wherein:
the second columnar semiconductor layers forming the first and second NMOS driver transistors are each equal to or longer in diameter than the first columnar semiconductor layers forming the first and second NMOS access transistors, or
the second columnar semiconductor layers forming the first and second NMOS driver transistors are each equal to or smaller in diameter than the first columnar semiconductor layers forming the first and second NMOS access transistors.

6. The semiconductor memory device according to claim 1, wherein:
the four MOS transistors are arranged in two rows and two columns on the substrate;
the first NMOS access transistor is arranged at the row 1 column 1;
the first NMOS driver transistor is arranged at the row 2 column 1;
the second NMOS access transistor is arranged at the row 1 column 2; and
the second NMOS driver transistor is arranged at the row 2 column 2.

7. The semiconductor memory device according to claim 6, wherein the contact formed on a gate wire extending from the gates of the first and second NMOS access transistors is shared.

8. The semiconductor memory device according to claim 1, wherein
the four MOS transistors are arranged in two rows and two columns on the substrate;
the first NMOS access transistor is arranged at the row 1 column 1;
the first NMOS driver transistor is arranged at the row 2 column 1;
the second NMOS access transistor is arranged at the row 2 column 2; and
the second NMOS driver transistor is arranged at the row 1 column 2.

* * * * *